US009702932B2

(12) United States Patent
Lin

(10) Patent No.: US 9,702,932 B2
(45) Date of Patent: Jul. 11, 2017

(54) ARITHMETIC LOGIC UNIT TESTING SYSTEM AND METHOD

(71) Applicant: Shanghai XinHao Micro Electronics Co. Ltd., Shanghai (CN)

(72) Inventor: Chenghao Kenneth Lin, Shanghai (CN)

(73) Assignee: SHANGHAI XINHAO MICRO ELECTRONICS CO., LTD., Shanghai (CN)

( * ) Notice: Subject to any disclaimer, the term of this patent is extended or adjusted under 35 U.S.C. 154(b) by 182 days.

(21) Appl. No.: 14/411,095

(22) PCT Filed: Jun. 28, 2013

(86) PCT No.: PCT/CN2013/078402
§ 371 (c)(1),
(2) Date: Dec. 23, 2014

(87) PCT Pub. No.: WO2014/000693
PCT Pub. Date: Jan. 3, 2014

(65) Prior Publication Data
US 2015/0192640 A1 Jul. 9, 2015

(30) Foreign Application Priority Data
Jun. 29, 2012 (CN) .......................... 2012 1 0224191

(51) Int. Cl.
*G01R 31/3177* (2006.01)
*G01R 31/3183* (2006.01)
(Continued)

(52) U.S. Cl.
CPC ..... *G01R 31/3177* (2013.01); *G01R 31/3183* (2013.01); *G01R 31/31703* (2013.01);
(Continued)

(58) Field of Classification Search
CPC .......... G01R 31/31703; G01R 31/3177; G01R 31/31713; G01R 31/31813; G01R 31/3183; G06F 11/2226
(Continued)

(56) References Cited

U.S. PATENT DOCUMENTS

2008/0010569 A1* 1/2008 Whetsel ......... G01R 31/318555
714/724
2008/0141089 A1* 6/2008 Maeda ............. G01R 31/31713
714/733

(Continued)

FOREIGN PATENT DOCUMENTS

CN 101004437 A 7/2007
CN 101995546 A 3/2011

*Primary Examiner* — John J Tabone, Jr.
(74) *Attorney, Agent, or Firm* — Anova Law Group, PLLC

(57) ABSTRACT

A testing system and method for an arithmetic logic unit are provided. The system includes: a control unit, a data providing unit, a first input unit, a second input unit, an arithmetic logic unit, an expected result unit, a comparator and a test result storage unit. The control unit controls the testing process. The data providing unit provides data for the first input unit, the second input unit and the expected result unit. The first input unit and the second input unit provide test data for the arithmetic logic unit. The arithmetic logic unit performs an operation and provides an operation result for the comparator. The expected result unit generates an expected result and provides the expected result of this round of testing for the comparator. The comparator compares the operation result with the expected result, and provides a comparison result for the test result storage unit.

24 Claims, 2 Drawing Sheets

(51) Int. Cl.
*G01R 31/3181* (2006.01)
*G01R 31/317* (2006.01)
*G06F 11/22* (2006.01)

(52) U.S. Cl.
CPC . *G01R 31/31713* (2013.01); *G01R 31/31813* (2013.01); *G06F 11/2226* (2013.01)

(58) Field of Classification Search
USPC ............. 714/735, 736, 733, 738, E11.155, 714/E11.169, E11.177
See application file for complete search history.

(56) References Cited

U.S. PATENT DOCUMENTS

| | | | | |
|---|---|---|---|---|
| 2010/0115354 A1* | 5/2010 | Whetsel | ......... | G01R 31/318536 714/726 |
| 2010/0213967 A1* | 8/2010 | Negishi | ............ | G01R 31/31726 324/762.01 |
| 2011/0167311 A1* | 7/2011 | Bailey | ................. | G06F 11/2294 714/733 |
| 2011/0276830 A1* | 11/2011 | Goishi | ............. | G01R 31/31813 714/32 |
| 2012/0159274 A1* | 6/2012 | Balakrishnan | ..... | G01R 31/3187 714/732 |
| 2013/0326299 A1* | 12/2013 | Oshima | .............. | G01R 31/3177 714/735 |
| 2014/0129889 A1* | 5/2014 | Matsumoto | ........ | G01R 31/3177 714/733 |

\* cited by examiner

ARITHMETIC LOGIC UNIT TESTING SYSTEM AND METHOD

TECHNICAL FIELD

The present invention generally relates to semiconductor device testing technologies and, more particularly, to a testing system and method for an arithmetic logic unit.

BACKGROUND ART

In product manufacturing process, product testing plays a vital role in enhancing product quality. Often, the product testing stage is required for many existing products. With technology development, an arithmetic logic unit is widely used to help accomplishing many kinds of repetitive and complex computational work, and to relieve people from such computational work, improving quality of life.

In general, an arithmetic logic unit (ALU) includes an adder, a multiplier, a shifter, a logic operation unit and a memory. Currently, the arithmetic logic unit is often tested mainly by the following testing methods:

The main control equipment in the testing process is controlled to provide input data for an arithmetic logic unit under testing and, at the same time, provides an expected-result unit with an expected result which is expected from the arithmetic logic unit after these input data is processed through the arithmetic logic unit.

Then, the arithmetic logic unit outputs an operation result, and the expected result unit outputs the expected result at the same time. The operation result and the expected result are provided for a comparator. A comparison result is obtained after the comparator completes a comparison. The comparison result is either the same or different. When the comparison result is the same, it indicates that the operation result of the arithmetic logic unit is correct; when the comparison result is different, it indicates that the operation result of the arithmetic logic unit is wrong, further indicating that the arithmetic logic unit is disqualified or has low reliability.

Meanwhile, in order to ensure the accuracy and reliability of test results, many rounds of testing are required for the same arithmetic logic unit (the number of testing is often hundreds or thousands). Thus, the expected result unit needs to store expected results from many rounds of testing. Therefore, a very large storage space is needed for the expected result unit. This will certainly make the expected result unit larger and more expensive, and difficult to be integrated with other devices (including the arithmetic logic unit under testing, the main control equipment, etc.). Therefore, the expected result unit cannot benefit from miniaturization and low cost from device integration.

DISCLOSURE OF INVENTION

Technical Problem

During the testing process, how to decrease the storage space of the expected result unit and still meet requirements of many rounds of testing becomes a challenging technical problem. The disclosed method and system are directed to solve one or more problems set forth above and other problems.

SOLUTION TO PROBLEM

Technical Solution

One aspect of the present disclosure includes a testing system for an arithmetic logic unit. The arithmetic logic unit testing system including a control unit, a data providing unit, a first input unit, a second input unit, an arithmetic logic unit, an expected result unit, a comparator and a test result storage unit, wherein the control unit controls the testing process; the data providing unit provides data for the first input unit, the second input unit and the expected result unit; the first input unit and the second input unit provide test data for the arithmetic logic unit; the arithmetic logic unit performs an operation and provides an operation result for the comparator; the expected result unit generates an expected result and provides the expected result of this round of testing for the comparator; the comparator compares the operation result with the expected result, and provides a comparison result for the test result storage unit.

Another aspect of the present disclosure includes a testing method for an arithmetic logic unit testing system. The testing system includes a control unit, a data providing unit, a first input unit, a second input unit, an arithmetic logic unit, an expected result unit, a comparator and a test result storage unit. The testing method includes starting the testing by the control unit, providing data for the first input unit, the second input unit and the expected result unit by the data providing unit, and providing test data for the arithmetic logic unit by the first input unit and the second input unit. The method also includes performing an operation and providing an operation result to the comparator by the arithmetic logic unit, generating an expected result and providing the expected result of this round of testing to the comparator by the expected result unit, and comparing the operation result with the expected result and providing a comparison result to the test result storage unit by the comparator. Further, the method includes controlling, by the control unit, whether to continue the testing or end the testing.

Other aspects of the present disclosure can be understood by those skilled in the art in light of the description, the claims, and the drawings of the present disclosure.

ADVANTAGEOUS EFFECTS OF INVENTION

Advantageous Effects

The disclosed systems and methods may provide fundamental solutions to the testing of arithmetic logic units in digital systems. Different from the conventional testing systems using a random vector generator, the disclosed systems and methods can provide the vectors according to the structure of the units, and may achieve the same or even better coverage than the covenantal ones within much shorter testing time. Further, the disclosed systems and methods may need much less hardware overhead comparing to the conventional testing systems using a ROM containing the vectors. Other advantages and applications are obvious to those skilled in the art.

BRIEF DESCRIPTION OF DRAWINGS

Description of Drawings

Figure 1:
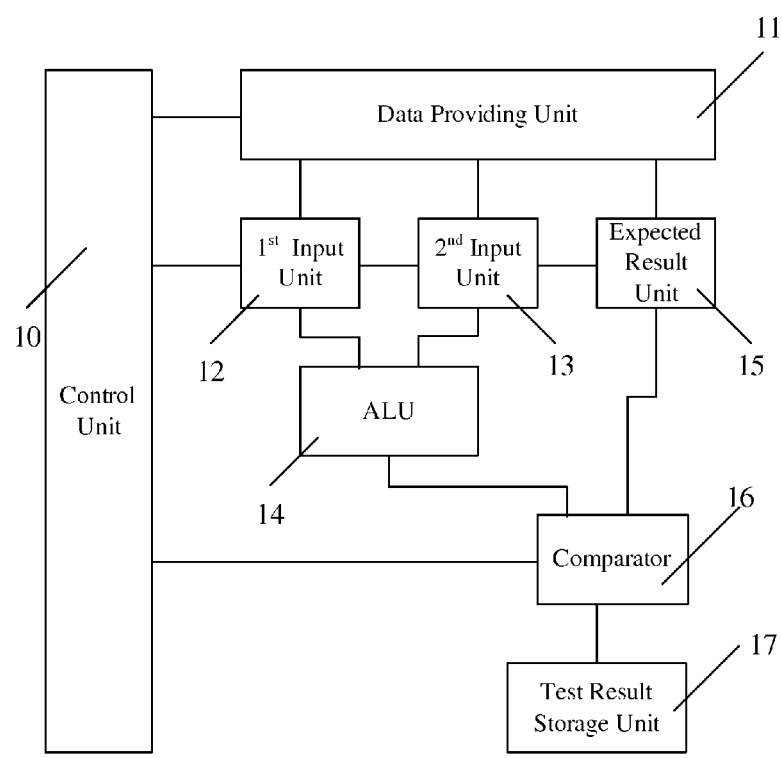
Figure 2:
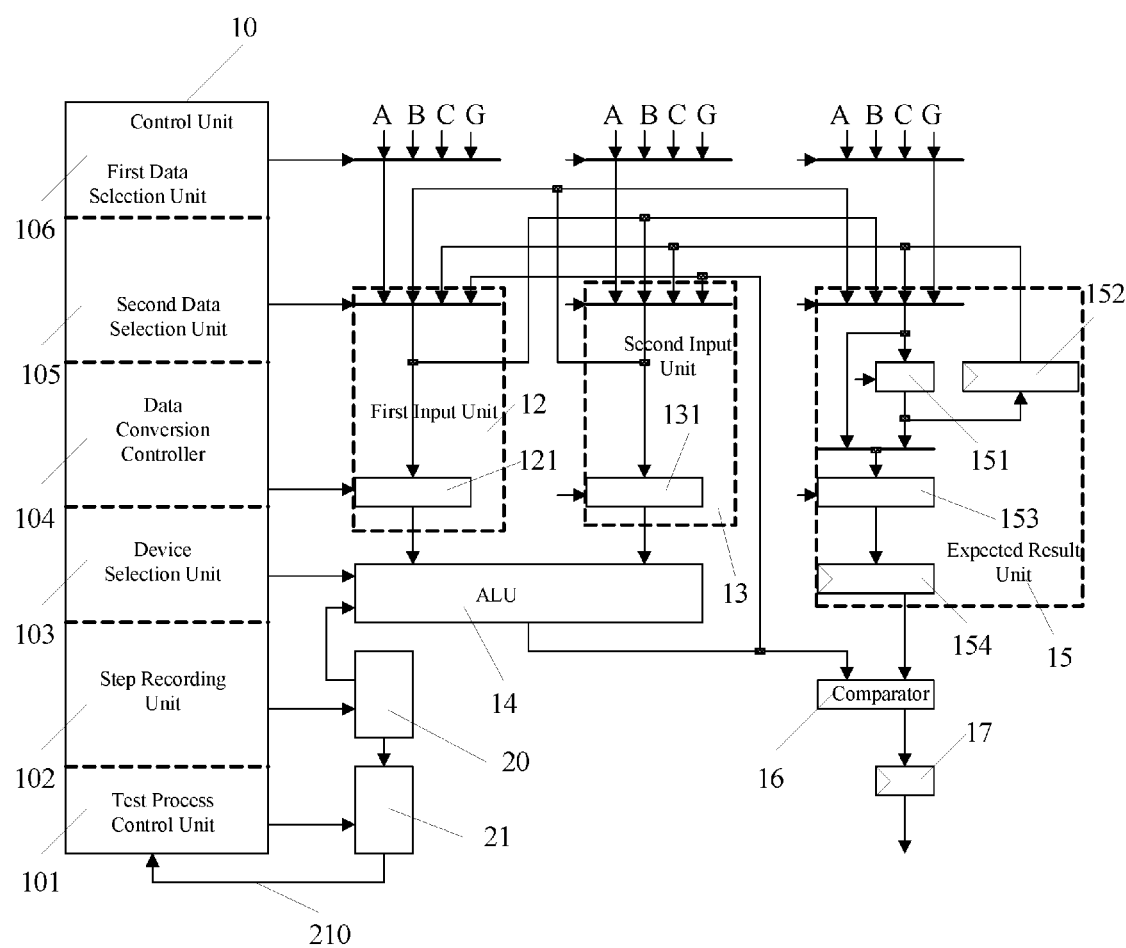

FIG. 1 illustrates a block diagram of a testing system for an arithmetic logic unit consistent with the disclosed embodiments; and FIG. 2 illustrates a structure diagram of a testing system for an arithmetic logic unit consistent with the disclosed embodiments.

BEST MODE FOR CARRYING OUT THE INVENTION

Best Mode

FIG. 1 illustrates an exemplary preferred embodiment(s).

MODE FOR THE INVENTION

Mode for Invention

Reference will now be made in detail to exemplary embodiments of the invention, which are illustrated in the accompanying drawings. The same reference numbers may be used throughout the drawings to refer to the same or like parts.

FIG. 1 shows a block diagram of a testing system for an arithmetic logic unit consistent with the disclosed embodiments. As shown in FIG. 1, the arithmetic logic unit testing system 1 includes a control unit 10, a data providing unit 11, a first input unit 12, a second input unit 13, an arithmetic logic unit 14, an expected result unit 15, a comparator 16, and a test result storage unit 17. Certain units may be omitted and other units may be added.

Various units may perform certain steps to complete a testing process of the arithmetic logic unit 14. For example, when performing the test, the control unit 10 may control testing process. The data providing unit 11 provides data for the first input unit 12, and the second input unit 13 and the expected result unit 15. Further, the first input unit 12 and the second input unit 13 provide test data for the arithmetic logic unit 14.

The arithmetic logic unit 14 performs an operation on the test data received, and provides the operation result for the comparator 16. On the other hand, the expected result unit 15 generates the expected result and provides the expected result of this round of testing to the comparator 16. As used herein, the arithmetic logic unit 14 may be one or more of an adder, a multiplier, a shifter, a logic operation unit and a memory. Other type of unit may also be included.

Further, the comparator 16 compares the operation result with the expected result, and provides a comparison result for the test result storage unit 17.

Because the expected result unit 15 generates the expected result, instead of storing expected results, and provides the expected result of this round of testing for the comparator 16, the expected result unit 15 may only needs to store the expected result of one round of testing, reducing storage space for the expected results in the expected result unit 15. Of course, more than one rounds of testing results may also be stored, as long as the number of the rounds of testing results stored is significantly less than the total number of testing rounds.

In certain embodiments, the expected result unit 15 only stores the expected result of the current round of testing, greatly reducing the storage space for storing the expected results. Of course, in other embodiments, the expected result unit 15 may store the expected results of several rounds of testing, such as the current round, previous three rounds of expected results, and next three rounds of expected results, etc.

Further, the control unit 10, the data providing unit 11, the first input unit 12, the second input unit 13, the arithmetic logic unit 14, the expected result unit 15, the comparator 16 and the test result storage unit 17 are integrated on the same chip. Because the expected result unit 15 stores less amount of data, the required storage space is correspondingly less.

Accordingly, the appearance (spatial structure) of the expected result unit is small, such that the arithmetic logic unit testing system can be integrated on the same chip, which can benefit from miniaturization, low cost and fast data transfer rate, etc., due to high-degree of integration.

In certain embodiments, the data providing unit 11 may provide data for the first input unit 12, the second input unit 13 and the expected result unit 15. Also, each of the first input unit 12, the second input unit 13 and the expected result unit 15 may respectively provide data for other units, i.e., the first input unit 12 may provide data for the second input unit 13 and the expected result unit 15; the second input unit 13 may provide data for the first input unit 12 and the expected result unit 15; the expected result unit 15 may provide data for the first input unit 12 and the second input unit 13. Therefore, multiple sources of data are used as testing data in the testing system.

Taking into account testing coverage of the arithmetic logic unit and the storage capacity of the data providing unit 11, the data stored in the data providing unit 11 may be three constants, a binary number that all bits are 0 (indicated by 'A'), a binary number that all bits are alternatingly 0 and 1 (indicated by 'B'), and a binary number with only the least significant bit being 1 (indicated by 'C'). Thus, for a four-digit binary number, the three constants respectively correspond to '0000', '0101' and '0001'. For a sixteen-digit binary number, the three constants respectively correspond to '0000 0000 0000 0000', '0101 0101 0101 0101' and '0000 0000 0000 0001'. Of course, any binary number, e.g., thirty-two-digit binary number, sixty-four-digit binary number, etc., may be used.

Meanwhile, in order to further meet testing requirements for the arithmetic logic unit and improve the testing coverage of the arithmetic logic unit, the data providing unit 11 also pre-sets a data output bit, which may provide new data based on the testing requirements (indicated by 'G'). Such new data may be generated by a counter or other proper logic.

Further, the expected result of the expected result unit 15 may be the data itself provided by the data providing unit 11, the first input unit 12, and/or the second input unit 13, or may be shifted data or inverted data from the data provided by the data providing unit 11, the first input unit 12, and/or the second data input unit 13, i.e., the expected result of the expected result unit 15 is a function (e.g., certain conversion or transformation) of the data obtained by the expected result unit 15 (input data).

Further, the expected result of the expected result unit 15 may also be a constant. For example, a binary number whose all bits are 0 may be a constant 'A', e.g., a four-digit binary number '0000'; a sixteen-digit binary number '0000 0000 0000 0000', etc. The result binary number may have all bits as 1, for example, a four-digit binary number '1111'; a sixteen-digit binary number '1111 1111 1111 1111', which is a binary number inverted from the constant 'A'. The special test result design may improve the reliability and the testing coverage.

When the expected result that is a constant is tested, all situations that can obtain this kind of constant are tested. For example, when the arithmetic logic unit 14 is an adder and the constant is '1111', all situations that can obtain '1111' are tested to ensure the testing coverage, such as the input is respectively '0000' and '1111'; '0001' and '1110'; '0010' and '1101', and so on.

Further, the expected result of the expected result unit 15 may also be a result of an inverse operation. As used herein, an "inverse operation" is used with respect to a "positive operation." The positive operation indicates an operation that is normally performed by the arithmetic logic unit, i.e., an ordinary function of a functional unit. For example, if the arithmetic logic unit is an adder, its positive operation refers to 'addition' operation; while its inverse operation refers to the opposite operation, that is, a 'subtraction' operation. The positive operation and the inverse operation may be implemented by the same arithmetic logic unit.

In a specific implementation, the data provided by the first input unit 12 or the second input unit 13 may be used as the expected result. Meanwhile, the arithmetic logic unit 14 may perform a positive operation on the test data provided by the first input unit 12 and the second input unit 13 to generate an intermediate result, and may send back the intermediate result to the first input unit 12 or the second input unit 13. Further, the intermediate result and the test data for such intermediate result (test data provided by the first input unit 12 or the second data input unit 13) are sent to the arithmetic logic unit 14 (i.e., the same arithmetic logic unit 14 that performs the forward operation) to perform an inverse operation. The operation result (i.e., the result from the positive operation and the inverse operation) is provided for the comparator 16. The comparator 16 compares the operation result provided by the arithmetic logic unit 14 with the expected result (i.e., data provided by the second input unit 13 or the first input unit 12 to the expected result unit 15).

For example, the arithmetic logic unit 14 (the arithmetic logic unit 14 is an adder) performs an addition operation on the data of the first data input unit 12 and data of the second data input unit 13 to obtain an intermediate result; while data of the second input unit 13 is provided for the expected result unit 15 as an expected result. The intermediate result has no corresponding expected result, but the intermediate result is sent back to the second input unit 13 as input data. The data of the first input unit 12 is subtracted from the input data by the arithmetic logic unit 14 (i.e., an inverse operation) becomes a final operation result. The final operation result is compared with the expected result (original data of the second input unit 13) by the comparator 16.

The above testing is feasible because the arithmetic logic unit can perform both the positive operation and the inverse operation. Similarly, based on such principle, if the arithmetic logic unit is a qualified/normal arithmetic logic unit, after performing the positive operation and the inverse operation on the input data, the arithmetic logic unit can generate an operation result the same as original input data, that is, the test data provided by the first input unit 12 or the second input unit 13. The operation result is compared with an expected result (the expected result is data provided by the first input unit 12 or the second input unit 13 in this case). If the comparison result is the same, the arithmetic logic unit is a qualified/normal arithmetic logic unit (or the arithmetic logic unit at least passes this round of testing).

Thus, for various expected results, the expected result unit 15 can generate such expected results according to the input data, eliminating the need for storing large amount of the expected results and reducing the expenditure of storage space. Meanwhile, the expected results take into account characteristics of testing, and realize the effect of testing.

FIG. 2 shows a structure diagram of a testing system for an arithmetic logic unit consistent with the disclosed embodiments. As shown in FIG. 2, further details of the arithmetic logic unit testing system 1 is explained. Specifically, the control unit 10 may include a testing process control unit 101, a step recording unit 102, a device selection unit 103, a first data selection unit 106, a second data selection unit 105, and a data conversion controller 104.

The testing process control unit 101 is configured to control the testing process. The step recording unit 102 is configured to record the number of steps. The device selection unit 103 is configured to select the arithmetic logic unit 14 and working mode of the arithmetic logic unit 14. Further, the first data selection unit 106 is configured to select data provided by the data providing unit 11, and the second data selection unit 105 is configured to select data respectively received by the first input unit 12, the second input unit 13 and the expected result unit 14. The data conversion controller 104 is configured to determine whether data in the first input unit 12, the second input unit 13, and/or the expected result unit 14 needs to be shifted or inverted.

The arithmetic logic unit testing system 1 further includes a step counter 20 and a memory address generator 21. The step counter 20 is configured to count steps, and the memory address generator 21 is configured to generate addresses.

The control unit 10 may be implemented by a memory that stores a testing program. Each unit described above may be a different area of the memory. The vertical section of the control unit 10 in FIG. 2 is used to represent lines of the testing program, and the horizontal section is used to represent positions of a specific control component. The testing process control unit 101, the step recording unit 102 and the step counter 20 together determine address 210 generated by the memory address generator 21 to determine the flow of the testing program.

Specifically, when the testing process control unit 101 (only one-digit binary number) is '0' and the step recording unit 102 is 'n1', this line of the testing program is executed n1 times (such as shifter 151 in the expected result unit 15 shifts 1 position every time), until the step counter 20 counts from 0 to n1. The step counter 20 then notifies the memory address generator 21 to point to the next line of the testing program. When the testing process control unit 101 (only one-digit binary number) is '0' and the step recording unit 102 is 'n2', the memory address generator 21 generates a line address at n2 lines before the current line address (i.e., jump back).

The testing process control unit 101 may be omitted. After the current line of the testing program is executed n1 times recorded in the step recording unit 102, the next line of the testing program is executed until all testing programs are executed completely.

The device selection unit 103 may use the operation code of the arithmetic logic unit. Therefore, when the arithmetic logic unit is tested, a decoder of the arithmetic logic unit is also tested at the same time.

Specifically, the arithmetic logic unit testing system 1 implements six testing steps.

Step 1: the control unit 10 controls the start of the testing.

Specifically, the testing is controlled by the testing process control unit 101. The arithmetic logic unit testing system 1 starts the testing controlled by one-digit binary number, for example, '1' indicates that the testing starts; correspondingly, the same one-digit binary number indicates that the testing ends, for example, '0' indicates that the testing ends.

Step 2: the data providing unit 11 provides data for the first input unit 12, the second input unit 13 and the expected result unit 15.

Specifically, the data providing unit 11 stores a plurality of data (a plurality of data may be provided for the first input unit 12, the second input unit 13 and the expected result unit 14); one or more data can be selected from the data stored in the data providing unit 11 by the first data selection unit 106 (in FIG. 2, four data provided by the data providing unit 11 are marked by 'A', 'B', 'C' and 'G' in the present embodiment, and correspondingly refers to the foregoing descriptions of the four data).

Step 3: the first input unit 12 and the second input unit 13 provide test data for the arithmetic logic unit 14.

Specifically, after the first input unit 12 and the second input unit 13 receive the data provided by the data providing unit 11, the obtained data that is used as the test data is provided to the arithmetic logic unit 14.

Further, in certain embodiments, the first input unit 12 may include a shifter/inverter 121, and the second input unit 13 may include a shifter/inverter 131. For the data obtained from the data providing unit 11, under the control of the data conversion controller 104, the first input unit 12 and the second input unit 13 may output the original data as the test data or the inverted/shifted data as the test data (the inverted data refers to the inverted data of original data, for example, if an original data is '0001', the inverted data is '1110'; the shifted data refers to the data obtained after shifting the original data, for example, if an original data is '0001', the data that is shifted to the left by one position is '0010', the data that is shifted to the left by two positions is '0100'). As a result, the volume of data sources of the test data is further increased, thus improving the test coverage.

Alternatively, the shifter/inverter 121 and the shifter/inverter 131 may be a simple inverter, and the shifting function is executed by the shifter 151 in the expected result unit 15, further reducing devices expenditure and cost of the arithmetic logic unit testing system 1.

In certain embodiments, the first input unit 12 and the second input unit 13 may not only obtain data from the data providing unit 11, but also provide data to each other. At the same time, the expected result unit 15 also provides data for the first input unit 12 and the second data input unit 13.

Meanwhile, with multiple data sources, the second data selection unit 105 selects data received respectively by the first input unit 12 and the second input unit 13. That is, the first input unit 12 may select the data provided by the data providing unit 11, the data provided by the second data input unit 13, or the data provided by the expected result unit 15; for the second input unit 13, the second data selection unit 105 also plays the same control role. Thus, both the richness of the data source of the test data and the orderliness of the testing can be met.

Step 4: the arithmetic logic unit 14 performs an operation and provides the operation result for the comparator 16, and the expected result unit 15 generates the expected result and provides the expected result of this round of testing to the comparator 16.

In general, the operation performed by the arithmetic logic unit 14 is a positive operations, i.e., when the arithmetic logic unit 14 is an adder, an addition operation is performed; when the arithmetic logic unit 14 is a multiplier, a multiplication operation is performed, unless clearly stated otherwise.

When the first input unit or the second input unit provides the test data for the arithmetic logic unit 14, the arithmetic logic unit provides the operation result obtained by performing a positive operation or an inverse operation for the comparator, that is, the arithmetic logic unit 14 performs the positive operation or the inverse operation. The detailed descriptions are omitted here.

The expected result unit 15 generates the expected result by the following steps:

First, the second data selection unit 105 selects a source that generates the expected result, that is, the source is selected from the expected result that is generated from data provided by the data providing unit 11, or the expected result that is generated from data provided by the first input unit 12, or the expected result that is generated from data provided by the second input unit 13. The expected result unit 15 may generate the expected result based on a variety of data sources.

Second, for the selected data source, the expected result unit 15 determines to shift or invert data under control of the data conversion unit 104, i.e., the finally-generated expected result may be inverted data/shifted data, so that the expected result unit 15 may generate a plurality of expected results to meet the requirements of different testing.

Step 5: the comparator 16 compares the operation result with the expected result, and provides a comparison result to the test result storage unit 17.

After the comparator 16 compares the operation result with the expected result, the obtained comparison result which includes the same/different result is provided to the test result storage unit 17. Specifically, the comparison result may be represented by one-digit binary number, for example, '0' denotes the operation result is the same as the expected result, while '1' denotes the operation result is the different from the expected result. Then the comparator 16 only needs to provide '0' or '1' for the test result storage unit 17.

Optionally, only when the operation result is different from the expected result, the test result storage unit 17 stores the comparison result, thus reducing storage of the test result storage unit 17.

Step 6: the control unit 10 controls whether to continue the testing or end the testing.

To end the testing, the control unit 10 may simply complete the testing, as previously described. The continuing test mode controlled by the control unit 10 can be implemented by the followings.

The testing for the arithmetic logic unit has the following two situations:

Situation 1. the same testing needs to be performed many times. The step recording unit 102 is used in this case.

Specifically, the step recording unit 102 provides the number of executions (testing) n1 (n1 is a non-negative integer) for the step counter 20. The step counter 20 counts the number. When the predetermined number of the executions is reached, the step counter 20 provides a trigger for the memory address generator 21. After receiving the trigger, the memory address generator 21 controls the testing process control unit 101 to perform the next step;

Situation 2. certain round of testing that is implemented needs to be implemented again, that is, the previous n2 th round of testing needs to be implemented again (n2 is a natural number). The step recording unit 102 is also used in this case. As used herein, the step recording unit 102 provides the value of n2 for the testing process control unit 101. Then, the testing process control unit 101 controls to execute the particular round of testing.

The different forms by which the testing process control unit 101 continues the testing can be distinguished by a one-digit binary number. For example, when the binary bit is '0', the form for continuing the testing: after the steps provided by the step recording unit 102 are executed, the next round of testing is performed. This generally refers to the Situation 1 described above, but if the same testing does not need to be executed multiple times, the number of steps provided in the step recording unit 102 may be ignored; or when the step recording unit 102 completes count 0 (count from '0'), the next round of testing is executed.

When the binary bit is '1', the form for continuing the test: based on the number of steps n2 provided by the step recording unit 102, the previous n2 th round of testing is performed (the n2 is a natural number).

As so far described, the arithmetic logic unit 14 is a general-purpose arithmetic logic unit (i.e., any one of an adder, a multiplier, a shifter, a logic operation unit or a memory). However, certain realization or implementation methods may be specific to a particular type of operation unit to which the arithmetic logic unit 14 is configured.

The Arithmetic Logic Unit is an Adder

First, according to previously described arithmetic logic unit testing system, a testing for an adder, that is, through a series of test data, multiple rounds of testing performed and test result (pass/fail) of the adder obtained, can be performed. The test data can be generated by the data provided by the data providing unit 11.

In order to reflect more intuitively the test cases where the data provided by the data providing unit 11 and, at the same time, the expected result unit 15 does not need to store a large number of the expected results for testing the adder (referring to the multiple rounds of testing), a few special cases for the test data are described below.

Referring to Table 1, Table 1 lists data outputted by the first input unit 12, the second input unit 13 and the expected result unit 15:

TABLE 1

| | CO | CI | | CO | CI | | CO | CI | | CO | CI |
|---|---|---|---|---|---|---|---|---|---|---|---|
| I1 | 0001 | 0 | I1 | 0010 | 0 | I1 | 0100 | 0 | I1 | 1000 | 0 |
| I2 | 1110 | | I2 | 1101 | | I2 | 1011 | | I2 | 0111 | |
| R | 0 1111 | | R | 0 1111 | | R | 0 1111 | | R | 0 1111 | |

Wherein, in Table 1, 'I1' denotes test data outputted by the first input unit 12; 'I2' denotes test data outputted by the second input unit 13; 'R' denotes test data outputted by the expected result unit 15; 'CI' denotes a carry input of the adder; 'CO' denotes a carry output of the adder.

Further, Table 1 provides the case that the expected result is a constant. Particularly, all bits in the binary number are '1'. The expected result can be a binary number with all bits '0' provided by the data providing unit 11, and the original data provided by the data providing unit 11 is inverted to obtain the binary number with all bits '1'.

The specific test cases listed in Table 1 can be implemented by the following methods:

The test data I1 outputted by the first input unit 12 may be implemented by a binary number with only the lowest bit being '1' provided by the data providing unit 11. Particularly, the '0001' is the original data provided by the data providing unit 11, and '0010', '0100' and '1000' are obtained easily by shifting the original data.

The test data I2 outputted by the second input unit 13 may be obtained by inverting the test data I1 outputted by the first input unit 12.

Specifically, the expected result '1111' is stored in the register 154 in the expected result unit 15 in order to provide the expected result R. Then the '0001' is performed a feedback operation that shifts all bits to the left by one position every cycle by the shifter 151 and the register 152 of the expected result unit 15 (i.e., every shift operation is based on the previous result). The output of the register 152 is sent to the first input unit 12 to provide I1, and sent to the second input unit 13 and performed an inversion operation to provide I2.

Four different kinds of testing cases may be implemented by the test data and the expected result provided by Table 1. At the same time, if I1 is interchanged with I2, other four different kinds of testing may be easily implemented. Therefore, 8 different kinds of testing cases are easily implemented in the present embodiment.

In addition, if I1 and I2 keep unchanged, other four different kinds of testing cases may be implemented by changing the input carry CI, specifically referring to Table 2:

TABLE 2

|    | CO   | CI |    | CO   | CI |    | CO   | CI |    | CO   | CI |
|----|------|----|----|------|----|----|------|----|----|------|----|
| I1 | 0001 | 1  | I1 | 0010 | 1  | I1 | 0100 | 1  | I1 | 1000 | 1  |
| I2 | 1110 |    | I2 | 1101 |    | I2 | 1011 |    | I2 | 0111 |    |
| R  | 1    | 0000 |  | R    | 1  | 0000 | | R  | 1  | 0000 | | R | 1 | 0000 |

In the testing case listed in Table 2, since the carry input CI is changed, the obtained expected result is also changed to a constant '0000', wherein the constant '0000' may be obtained from the data provided by the data providing unit 11, that is, a binary number with all bits '0' can be provided by the data providing unit 11. Thus, other four different kinds of testing cases may be implemented. Similarly, if I1 is interchanged with I2, other four different kinds of testing cases may be easily implemented.

Based on simple examples provided in Table 1 and Table 2, 16 different kinds of testing cases may be easily implemented. Further testing cases may be readily implemented by those skilled in the art. For example, more examples are provided in Table 2A and Table 2B.

TABLE 2A

|    | CO   | CI |    | CO   | CI |    | CO   | CI |    | CO   | CI |
|----|------|----|----|------|----|----|------|----|----|------|----|
| I1 | 0001 |    | I1 | 0010 |    | I1 | 0100 |    | I1 | 1000 |    |
| I2 | 0000 |    | I2 | 0000 |    | I2 | 0000 |    | I2 | 0000 |    |
| R  | 0001 |    | R  | 0    | 0010 | | R  | 0  | 0100 | | R | 1000 | |

In the example of Table 2A, specifically, the second input unit 13 is set to '0000'. Then the '0001' is performed a feedback operation that shifts all bits to the left by one position every cycle by the shifter 151 and the register 152. The output of the register 152 is sent to the first input unit 12 to provide I1. The output of the register 152 is also sent back to the expected result unit 15. The output of the register 152 bypasses the shifter 151 (the selector between the shifter 151 and the inverter 153 selects the input of the shifter 151), and then via the register 154 to provide the expected result R.

TABLE 2B

|    | CO   | CI |    | CO   | CI |    | CO   | CI |    | CO   | CI |
|----|------|----|----|------|----|----|------|----|----|------|----|
| I1 | 0000 | 0  | I1 | 0000 | 0  | I1 | 0000 | 0  | I1 | 0000 | 0  |
| I2 | 1110 |    | I2 | 1101 |    | I2 | 1011 |    | I2 | 0111 |    |
| R  | 0    | 1110 | | R | 0 | 1101 | | R | 0 | 1011 | | R | 0 | 0111 |

In the example of Table 2B, specifically, the first input unit 12 is set to '0000'. Then the '1110' is performed a feedback operation that shifts all bits to the left by one position every cycle by the shifter 151 and the register 152, filling '1' on the right side. The output of the register 152 is sent to the second input unit 13 to provide I2. The output of the register 152 is also sent back to the expected result unit 15. The output of the register 152 bypasses the shifter 151 (the selector between the shifter 151 and the inverter 153 selects the input of the shifter 151), and then via the register 154 to provide the expected result R.

To further illustrate that multiple rounds of different testing cases can be easily implemented through the data provided by the data providing unit 11 without storing large amount expected results in the expected result unit 15, three more tables (Table 3, Table 4 and Table 5) are provided.

Similarly, 'I1' denotes the test data outputted by the first input unit 12; 'I2' denotes the test data outputted by the second input unit 13; 'R' denotes the expected result outputted by the expected result unit 15; 'CI' denotes the carry input of the adder; 'CO' denotes the carry output of the adder.

The data in these tables may be obtained through the data provided by the data providing unit 11. Of course, the data may also be easily obtained by the data provided by the first input unit 12, the second input unit 13 or the expected result unit 15. The least amount of variation between the result data (i.e., the data outputted by the first input unit 12, the second input unit 13 or the expected result unit 15) and the original data (i.e., the data received by the first input unit 12, the second input unit 13 or the expected result unit 15) represents desired results.

TABLE 3

|    | CO   | CI |    | CO   | CI |    | CO   | CI |
|----|------|----|----|------|----|----|------|----|
| I1 | 0000 | 0  | I1 | 1111 | 0  | I1 | 1111 | 0  |
| I2 | 0000 |    | I2 | 0000 |    | I2 | 1111 |    |
| R  | 0    | 0000 | | R | 0 | 1111 | | R | 1 | 1110 |

TABLE 3-continued

|    | CO   | CI |    | CO   | CI |    | CO   | CI |
|----|------|----|----|------|----|----|------|----|
| I1 | 0000 | 1  | I1 | 1111 | 1  | I1 | 1111 | 1  |
| I2 | 0000 |    | I2 | 0000 |    | I2 | 1111 |    |
| R  | 0    | 0001 | | R | 1 | 0000 | | R | 1 | 1111 |
| I1 | 0000 | 0  | I1 | 0000 | 0  | I1 | 1111 | 0  |
| I2 | 0000 |    | I2 | 1111 |    | I2 | 1111 |    |
| R  | 0    | 0000 | | R | 0 | 1111 | | R | 1 | 1110 |
| I1 | 0000 | 1  | I1 | 0000 | 1  | I1 | 1111 | 1  |
| I2 | 0000 |    | I2 | 1111 |    | I2 | 1111 |    |
| R  | 0    | 0001 | | R | 1 | 0000 | | R | 1 | 1111 |

TABLE 4

| | | CO | CI | | | CO | CI | | | CO | CI |
|---|---|---|---|---|---|---|---|---|---|---|---|
| I1 | | 0001 | 0 | I1 | | 1110 | 0 | I1 | | 0011 | 0 |
| I2 | | 0000 | | I2 | | 1111 | | I2 | | 1100 | |
| R | 0 | 0001 | | R | 1 | 1101 | | R | 0 | 1111 | |
| I1 | | 0001 | 1 | I1 | | 1110 | 1 | I1 | | 0011 | 1 |
| I2 | | 0000 | | I2 | | 1111 | | I2 | | 1100 | |
| R | 0 | 0010 | | R | 1 | 1110 | | R | 1 | 0000 | |
| I1 | | 0000 | 0 | I1 | | 1111 | 0 | I1 | | 1100 | 0 |
| I2 | | 0001 | | I2 | | 1110 | | I2 | | 0011 | |
| R | 0 | 0001 | | R | 1 | 1101 | | R | 0 | 1111 | |
| I1 | | 0000 | 1 | I1 | | 1111 | 1 | I1 | | 1100 | 1 |
| I2 | | 0001 | | I2 | | 1110 | | I2 | | 0011 | |
| R | 0 | 0010 | | R | 1 | 1110 | | R | 1 | 0000 | |

TABLE 5

| | | CO | CI | | | CO | CI | | | CO | CI |
|---|---|---|---|---|---|---|---|---|---|---|---|
| I1 | | 1101 | 0 | I1 | | 0101 | 0 | I1 | | 0101 | 0 |
| I2 | | 1111 | | I2 | | 1010 | | I2 | | 0000 | |
| R | 1 | 1100 | | R | 0 | 1111 | | R | 0 | 0101 | |
| I1 | | 1101 | 1 | I1 | | 0101 | 1 | I1 | | 0101 | 1 |
| I2 | | 1111 | | I2 | | 1010 | | I2 | | 0000 | |
| R | 1 | 1101 | | R | 1 | 0000 | | R | 0 | 0110 | |
| I1 | | 1111 | 0 | I1 | | 1010 | 0 | I1 | | 0000 | 0 |
| I2 | | 1101 | | I2 | | 0101 | | I2 | | 0101 | |
| R | 1 | 1100 | | R | 0 | 1111 | | R | 0 | 0101 | |
| I1 | | 1111 | 1 | I1 | | 1010 | 1 | I1 | | 0000 | 1 |
| I2 | | 1101 | | I2 | | 0101 | | I2 | | 0101 | |
| R | 1 | 1101 | | R | 1 | 0000 | | R | 0 | 0110 | |

The above data may be obtained by changing the data provided by the data providing unit 11. The detailed descriptions are not repeated here. However, a special case is described here, i.e., the data '0011' may be obtained by shifting all bits to the left by one position and filling '1' in the right side of the data '0001' provided by the data providing unit 11. In the present application, the shifting usually refers to shift all bits to the left by one position and filling '0' in the right side of the data, although shifting to the right may also be used. After the data '0011' is obtained, the data '0110' and the data '1100' can be easily obtained by shifting all bits of '0011' to the left and filling '0' in the right side of the data.

The Arithmetic Logic Unit is a Multiplier

Table 6 lists data outputted by the first input unit 12, the second input unit 13 and the expected result unit 15 in the multiplier:

TABLE 6

| | CO | | | CO | | | CO |
|---|---|---|---|---|---|---|---|
| I1 | 0000 | I1 | | 0001 | I1 | | 0101 |
| I2 | SC | I2 | | SC | I2 | | SC |
| R | I1 | R | X | SR | R | X | SR |
| I1 | SC | I1 | | SC | I1 | | SC |
| I2 | 0000 | I2 | | 0001 | I2 | | 0101 |
| R | I2 | R | X | SR | R | X | SR |

In Table 6, 'I1' denotes the test data outputted by the first input unit 12; 'I2' denotes the test data outputted by the second input unit 13; 'R' denotes the expected result outputted by the expected result unit 15. In order to reflect more available test data in Table 6, in addition to the specific test data, a 'formula' is used, wherein, 'SC' denotes the data C (that is, a binary number that only lowest bit is '1') provided by the data providing unit 11 is shifted; 'SR' denotes the expected result R is shifted.

For example, during the first round of testing, if I1 data and I2 data are respectively '0001' and C, an expected result is 'R', that is, the expected result is C. The first input unit 12 provides the data for the expected result unit 15 to obtain the expected result C. Subsequently, during the second round of testing, I1 data is '0001', I2 data and an expected result are respectively SC and 'SR'. Both the I2 data and the expected result shift all bits to the left by one position. Specifically, the shifter 151 shifts the expected result R that is stored in the register 152 in the expected result unit 15, and the final expected result unit 15 outputs SR.

It should be noted that an the eight-bit binary number is resulted from a multiplication operation of two four-digit binary numbers. Only the lower 4 bits of the eight-bit binary number are listed in the example for illustrative purposes. When comparing the operation result with the expected result in the comparator 16, all bits may be compared or only the lower four bits may be compared. It is understood that the disclosed components or devices are for illustrative purposes and not limiting.

The arithmetic logic unit is a logic operation unit

Table 7 lists data outputted by the first input unit 12, the second input unit 13 and the expected result unit 15 in a logical AND operation unit:

TABLE 7

| I1 | 0000 | I1 | 1111 | I1 | 1111 |
|---|---|---|---|---|---|
| I2 | 0000 | I2 | 0000 | I2 | 1111 |
| R | 0000 | R | 0000 | R | 1111 |
| I1 | 0001 | I1 | 1110 | I1 | 0011 |
| I2 | 0000 | I2 | 1111 | I2 | 1100 |
| R | 0000 | R | 1110 | R | 0000 |
| I1 | 1101 | I1 | 0101 | I1 | 0101 |
| I2 | 1111 | I2 | 1010 | I2 | 0101 |
| R | 1101 | R | 0000 | R | 0101 |

In Table 7, 'I1' denotes the test data outputted by the first input unit 12; 'I2' denotes the test data outputted by the second input unit 13; 'R' denotes the expected result outputted by the expected result unit 15.

The data listed in Table 7 is obtained through the data provided by the data providing unit 11. Of course, the data may also be easily obtained from the data provided by the first input unit 12, the second input unit 13 or the expected result unit 15. The least amount of variation between the result data (i.e., the data outputted by the first input unit 12, the second input unit 13 or the expected result unit 15) and the original data (i.e., the data received by the first input unit 12, the second input unit 13 or the expected result unit 15) represents desired result.

Table 8 lists data outputted by the first input unit 12, the second input unit 13 and the expected result unit 15 in a logical OR operation unit:

TABLE 8

| | | CO | CI | | | CO | CI | | | CO | CI |
|---|---|---|---|---|---|---|---|---|---|---|---|
| I1 | | 0000 | X | I1 | | 1111 | X | I1 | | 1111 | X |
| I2 | | 0000 | | I2 | | 0000 | | I2 | | 1111 | |
| R | X | 0000 | | R | X | 1111 | | R | X | 1111 | |
| I1 | | 0001 | | I1 | | 1110 | | I1 | | 0011 | |
| I2 | | 0000 | | I2 | | 1111 | | I2 | | 1100 | |
| R | X | 0001 | | R | X | 1110 | | R | X | 1111 | |
| I1 | | 1101 | | I1 | | 0101 | | I1 | | 0101 | |
| I2 | | 1111 | | I2 | | 1010 | | I2 | | 0101 | |
| R | X | 1111 | | R | X | 1111 | | R | X | 0101 | |

In Table 8, 'I1' denotes the test data outputted by the first input unit 12; 'I2' denotes the test data outputted by the second input unit 13; 'R' denotes the expected result outputted by the expected result unit 15.

The data listed in Table 8 is obtained through the data provided by the data providing unit 11. Of course, the data may also be easily obtained from the data provided by the first input unit 12, the second input unit 13 or the expected result unit 15. The least amount of variation between the result data (i.e., the data outputted by the first input unit 12, the second input unit 13 or the expected result unit 15) and the original data (i.e., the data received by the first input unit 12, the second input unit 13 or the expected result unit 15) represents desired result.

Table 9 lists data outputted by the first input unit 12, the second input unit 13 and the expected result unit 15 in a logical XOR operation unit:

TABLE 9

| | CO | | CI | | CO | | CI | | CO | | CI |
|---|---|---|---|---|---|---|---|---|---|---|---|
| I1 | | | 0000 | X | I1 | | | | 1111 | X | I1 | | | 1111 | X |
| I2 | | | 0000 | | I2 | | | | 0000 | | I2 | | | 1111 | |
| R | X | 0000 | | | R | X | 1111 | | | R | X | 0000 | |
| I1 | | | 0001 | X | I1 | | | | 1110 | X | I1 | | | 0011 | X |
| I2 | | | 0000 | | I2 | | | | 1111 | | I2 | | | 1100 | |
| R | X | 0001 | | | R | X | 0001 | | | R | X | 1111 | |
| I1 | | | 1101 | X | I1 | | | | 0101 | X | I1 | | | 0101 | X |
| I2 | | | 1111 | | I2 | | | | 1010 | | I2 | | | 0101 | |
| R | X | 0010 | | | R | X | 1111 | | | R | X | 0000 | |

In Table 9, 'I1' denotes the test data outputted by the first input unit 12; 'I2' denotes the test data outputted by the second input unit 13; 'R' denotes the expected result outputted by the expected result unit 15.

The data listed in Table 9 is obtained through the data provided by the data providing unit 11. Of course, the data may also be easily obtained from the data provided by the first input unit 12, the second input unit 13 or the expected result unit 15. The least amount of variation between the result data (i.e., the data outputted by the first input unit 12, the second input unit 13 or the expected result unit 15) and the original data (i.e., the data received by the first input unit 12, the second input unit 13 or the expected result unit 15) represents desired result.

If the arithmetic logic unit is a memory or a shifter, the expected result is more easily generated by the expected result unit 15. When the arithmetic logic unit is a memory, the expected result unit 15 may obtain data outputted by the first input unit 12 or the second input unit 13 as an expected result; when the arithmetic logic unit is a shifter, the expected result unit 15 may obtain data outputted by the first input unit 12 or the second input unit 13 and perform a shift operation to generate the expect result. The detailed descriptions are not repeated here.

Further, when the arithmetic logic unit is a memory, the step recording unit 20 may provide the memory address.

When the arithmetic logic unit is a shifter, the device selection unit 103 selects the arithmetic logic unit 14 as a shifter. The amount of shifting provided by the step recording unit 102 is 20 bits (the amount of shifting may also be provided by either the first input unit 12 or the second input unit 13). The first input unit 12 or the second input unit 13 provides test data that needs to be shifted, for example, '0000 0000 0000 0000 0000 0000 0000 0001'.

In the testing, the shifter performs the operations 20 times. The amount of shifting provided by the step recording unit 20 is respectively 1 position, 2 positions, 3 positions, . . . , 20 positions each time. At the same time, the expected result of the first round of testing provided by the expected result unit 15 is the result from the data provided by the first input unit 12 or the second input unit 13 being shifted by 1 position. The expected result of the next round of testing is obtained by shifting the expected result of the current round of testing by 1 position. Therefore, the testing can be done 20 times, improving the test coverage.

The shifting mode of the expected result unit 15 may be implemented by only shifting data by 1 position using the shifter 151 and the register 152 every time, that is, all bits of the data is shifted by 1 position and the shifted data is stored in the register 152. The data stored in the register is fed back to the input of the shifter, and all bits of the data is shifted by 1 position again and stored in the register 152. The shifting is repeated until the data is completely shifted by 19 positions or bits.

Specifically, in the first round, the shifter shifts '0000 0000 0000 0000 0000 0000 0000 0001' by 1 position to obtain the data '0000 0000 0000 0000 0000 0000 0000 0010'; while the expected result unit 15 also shifts '0000 0000 0000 0000 0000 0000 0000 0001' by 1 position to obtain the data '0000 0000 0000 0000 0000 0000 0000 0010'.

In the second round, the shifter shifts '0000 0000 0000 0000 0000 0000 0000 0001' by 2 position to obtain the data '0000 0000 0000 0000 0000 0000 0000 0100'; while the expected result unit 15 also shifts '0000 0000 0000 0000 0000 0000 0000 0010' by 1 position to obtain the data '0000 0000 0000 0000 0000 0000 0000 0100'. The same pattern may be implemented for the following rounds.

Of course, in every round, both the shifter and the expected result unit 15 output the operation result and the expected result to the comparator 16 to perform a comparison operation. The detailed descriptions are not repeated here.

Without departing from the spirit and principles of the present invention, any modifications, equivalent replacements, and improvements, etc., should be included in the protection scope of the present invention. Therefore, the scope of the present disclosure should be defined by the attached claims.

INDUSTRIAL APPLICABILITY

The disclosed systems and methods may be used in various applications in the testing of the devices including arithmetic logic units. For example, the disclosed systems and methods may be used to provide low cost and high coverage testing of arithmetic logic units of CPUs or MCUs.

SEQUENCE LISTING FREE TEXT

Sequence List Text

The invention claimed is:
1. A testing system for an arithmetic logic unit comprising:
   a control unit,
   a data providing unit coupled to the control unit,
   a first input unit coupled to the data providing unit,
   a second input unit, separate from the first input unit, coupled to the data providing unit,
   an arithmetic logic unit coupled to the first input unit and the second input unit,
   an expected result unit, a comparator coupled to the arithmetic logic unit and the expected result unit, and
a test result storage unit coupled to the comparator, wherein:
the control unit controls a testing process;
the data providing unit provides inputs to the first input unit, the second input unit and the expected result unit;
the first input unit and the second input unit provide test data to the arithmetic logic unit;
the arithmetic logic unit performs an operation and provides an operation result to the comparator;
the expected result unit generates an expected result and provides the expected result of a current round of testing to the comparator; and
the comparator compares the operation result with the expected result and provides a comparison result to the test result storage unit,
wherein the control unit comprises:
a testing process control unit configured to control the testing process;
a step recording unit configured to record a number of steps;
a device selection unit configured to select the arithmetic logic unit and a working mode of the arithmetic logic unit;
a first data selection unit configured to select the inputs provided by the data providing unit;
a second data selection unit configured to select the inputs respectively received by the first input unit, the second input unit and the expected result unit; and
a data conversion controller configured to determine whether data in the first input unit, the second input unit and the expected result unit needs to be shifted or inverted.

2. The system according to claim 1, wherein:
the control unit, the data providing unit, the first input unit, the second input unit, the arithmetic logic unit, the expected result unit, the comparator and the test result storage unit are integrated on a same chip.

3. The system according to claim 1, wherein:
the expected result unit stores the expected result of the current round of testing.

4. The system according to claim 1, wherein the inputs provided by the data providing unit includes:
a first binary number that all bits are 0;
a second binary number that all bits are alternatingly 0 and 1; and
a third binary number that only a least significant bit is 1.

5. The system according to claim 1, wherein:
the expected result provided by the expected result unit is a function of an input provided by the data providing unit.

6. The system according to claim 5, wherein:
the expected result provided by the expected result unit is obtained by shifting or inverting the input provided by the data providing unit.

7. The system according to claims 1, wherein:
the expected result provided by the expected result unit is a constant.

8. The system according to claim 7, wherein:
the expected result provided by the expected result unit is a binary number that all bits are 0 or a binary number that all bits are 1.

9. The system according to claims 1, wherein:
the expected result provided by the expected result unit is the test data provided for the arithmetic logic unit from the first input unit or the second input unit.

10. The system according to claim 9, wherein:
the operation result is obtained by a positive operation and an inverse operation of the arithmetic logic unit, and is provided to the comparator.

11. The system according to claims 1, wherein:
at least one of the first input unit, the second input unit, and the expected result unit provides data to the second input unit and the expected result unit.

12. The system according to claims 1, wherein:
when the operation result is different from the expected result, the test result storage unit stores the comparison result.

13. A testing method for an arithmetic logic unit testing system including a control unit, a data providing unit, a first input unit, a second input unit separate from the first input unit, an arithmetic logic unit, an expected result unit, a comparator and a test result storage unit, the method comprising:
starting the testing by the control unit;
providing, by the data providing unit, inputs to the first input unit, the second input unit and the expected result unit;
providing, by the first input unit and the second input unit, test data for the arithmetic logic unit;
performing an operation and providing an operation result to the comparator by the arithmetic logic unit;
generating an expected result and providing the expected result of a current round of testing to the comparator by the expected result unit;
comparing the operation result with the expected result and providing a comparison result to the test result storage unit by the comparator; and
controlling, by the control unit, whether to continue the testing or end the testing,
wherein the control unit comprises:
a testing process control unit configured to control a testing process;
a step recording unit configured to record a number of steps;
a device selection unit configured to select the arithmetic logic unit and a working mode of the arithmetic logic unit;
a first data selection unit configured to select the inputs provided by the data providing unit;
a second data selection unit configured to select the inputs respectively received by the first input unit, the second input unit and the expected result unit; and
a data conversion controller configured to determine whether data in the first input unit, the second input unit and the expected result unit needs to be shifted or inverted.

14. The method according to claim 13, wherein:
the control unit, the data providing unit, the first input unit, the second input unit, the arithmetic logic unit, the expected result unit, the comparator and the test result storage unit are integrated on a same chip.

15. The method according to claim 13, wherein:
the expected result unit stores the expected result of the current round of testing.

16. The method according to claim 13, wherein the inputs provided by the data providing unit includes:
a first binary number that all bits are 0;
a second binary number that all bits are alternatingly 0 and 1; and
a third binary number that only a least significant bit is 1.

17. The method according to claims 13, wherein:
the expected result provided by the expected result unit is
a function of an input provided by the data providing
unit.
18. The method according to claim 17, wherein:
the expected result provided by the expected result unit is
obtained by shifting or inverting the input provided by
the data providing unit.
19. The method according to claims 13, wherein:
the expected result provided by the expected result unit is
a constant.
20. The method according to claim 19, wherein:
the expected result provided by the expected result unit is
a binary number that all bits are 0 or a binary number
that all bits are 1.
21. The method according to claims 13, wherein:
the expected result provided by the expected result unit is
the test data provided to the arithmetic logic unit from
the first input unit or the second input unit.
22. The method according to claim 21, wherein:
the operation result is obtained by a positive operation and
an inverse operation of the arithmetic logic unit, and is
provided to the comparator.
23. The method according to claims 13, wherein:
at least one of the first input unit, the second input unit,
and the expected result unit provides input data to the
second input unit and the expected result unit.
24. The method according to claims 13, wherein:
when the operation result is different from the expected
result, the test result storage unit stores the comparison
result.

\* \* \* \* \*